(12) United States Patent
Koh

(10) Patent No.: US 11,763,859 B2
(45) Date of Patent: Sep. 19, 2023

(54) DATA SORTING CONTROL CIRCUIT AND MEMORY DEVICE INCLUDING THE SAME

(71) Applicant: SK hynix Inc., Gyeonggi-do (KR)

(72) Inventor: In Sung Koh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/678,488

(22) Filed: Feb. 23, 2022

(65) Prior Publication Data

US 2022/0180906 A1 Jun. 9, 2022

Related U.S. Application Data

(62) Division of application No. 17/139,006, filed on Dec. 31, 2020, now Pat. No. 11,282,551.

(30) Foreign Application Priority Data

Apr. 24, 2020 (KR) .................. 10-2020-0050046

(51) Int. Cl.
*G11C 7/00* (2006.01)
*G11C 7/10* (2006.01)

(52) U.S. Cl.
CPC ............ *G11C 7/1066* (2013.01); *G11C 7/106* (2013.01); *G11C 7/1069* (2013.01)

(58) Field of Classification Search
CPC ..................................................... G11C 7/106
USPC .................................................... 365/189.15
See application file for complete search history.

(56) References Cited

U.S. PATENT DOCUMENTS

2016/0172018 A1* 6/2016 Nam .................. G11C 7/1087
365/189.05

* cited by examiner

*Primary Examiner* — Hoai V Ho
(74) *Attorney, Agent, or Firm* — IP & T GROUP LLP

(57) ABSTRACT

A data sorting control circuit includes a phase detector suitable for detecting a phase of each of a first clock signal, a second clock signal, a third clock signal, and a fourth clock signal in response to a read command, an order determiner suitable for determining a data order as a first order or a second order based on a seed address and the detected phase of each of the clock signals, and an sorting control signal generator suitable for shifting the read command based on the first clock signal to the fourth clock signal to generate a first sorting control signal, a second sorting control signal, a third sorting control signal, and a fourth sorting control signal, and outputting the first sorting control signal to the fourth sorting control signal according to the first order or the second order.

9 Claims, 4 Drawing Sheets

DATA SORTING CONTROL CIRCUIT AND MEMORY DEVICE INCLUDING THE SAME

CROSS-REFERENCE TO RELATED APPLICATION(S)

This application is a division of U.S. patent application Ser. No. 17/139,006 filed on Dec. 31, 2020, which claims benefits of priority of Korean Patent Application No. 10-2020-0050046 filed on Apr. 24, 2020. The disclosure of each of the foregoing application is incorporated herein by reference in its entirety.

BACKGROUND

1. Field

The disclosure relates to memory devices that determine the order of read data, sort data in the determined order, and output the data.

2. Description of the Related Art

Recent increase in the operation speed of memory systems has led to demand for higher data transfer rates in memory devices included in memory systems. To meet the high-rate or high-bandwidth transfer of data serially input to, and output from, a memory device, the memory device sorts the data by prefetching. Prefetching refers to latching and parallelizing data inputted serially. For parallelizing data, clock dividing is used. A system clock signal is divided into multi-phase clock signals with different phases, and data is parallelized and serialized using the multi-phase clock signals.

The memory device exchanges data with external devices via a limited number of pins or pads. The size of input/output data gradually increases. To increase the data input/output speed, various circuits are provided in the memory device. Various parameters for the internal operation of the memory device are defined in the specifications to ensure more stable operation.

For example, the memory device may output a plurality of bits of data in response to a single read command. The number of bits or order of data to be outputted simultaneously may be set by the burst length or burst type of the mode register set. Further, the memory device may sort data in the burst order determined according to the seed address inputted along with the read command and output the data. The memory device may include a circuit for controlling the burst order according to the seed address.

SUMMARY

According to the disclosure, there is provided a memory device that may generate sorting control signals based on conditions for determining the order of read data, and thus reduce the current consumption of read operation.

In accordance with an embodiment of the present invention, a data sorting control circuit may include: a phase detector suitable for detecting a phase of each of a first clock signal, a second clock signal, a third clock signal, and a fourth clock signal in response to a read command; an order determiner suitable for determining a data order as a first order or a second order based on a seed address and the detected phase of each of the clock signals; and an sorting control signal generator suitable for shifting the read command based on the first clock signal to the fourth clock signal to generate a first sorting control signal, a second sorting control signal, a third sorting control signal, and a fourth sorting control signal, and outputting the first sorting control signal to the fourth sorting control signal according to the first order or the second order.

In accordance with another embodiment of the present invention, a memory device may include: a memory cell array including a plurality of memory cells; a data sorting control circuit suitable for determining a data order based on a read command, a clock signal, and a seed address and generating a selection control signal and a plurality of sorting control signals according to the determined data order; and a data sorting circuit suitable for sorting a plurality of data read from the memory cell array to output serial data in response to the selection control signal and the plurality of sorting control signals.

In accordance with another embodiment of the present invention, a memory device may include: a memory cell array; a data sorting control circuit suitable for detecting at which edge of a clock signal a read command is input, determining a data order based on a combination of a seed address and the detected edge, and generating a sorting control signal and a selection control signal, based on the data order; and a data sorting circuit suitable for receiving a plurality of data items in parallel from the memory cell array, sorting the plurality of data items based on the sorting control signal and the selection control signal and serially outputting the sorted data items.

DETAILED DESCRIPTION

Embodiments of the disclosure are described below in detail with reference to the accompanying drawings to enable one skilled in the art to readily practice the invention. However, the invention may be configured, arranged and/or carried out in various other ways, as those skilled in the art will understand from the present disclosure. Thus, the invention is not limited to the embodiments disclosed herein. The embodiments are examples only. The invention is defined only by the appended claims. Moreover, the following description primarily focuses on features and aspects of the embodiments, omitting unnecessary description to clarify the subject matter of the disclosure. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
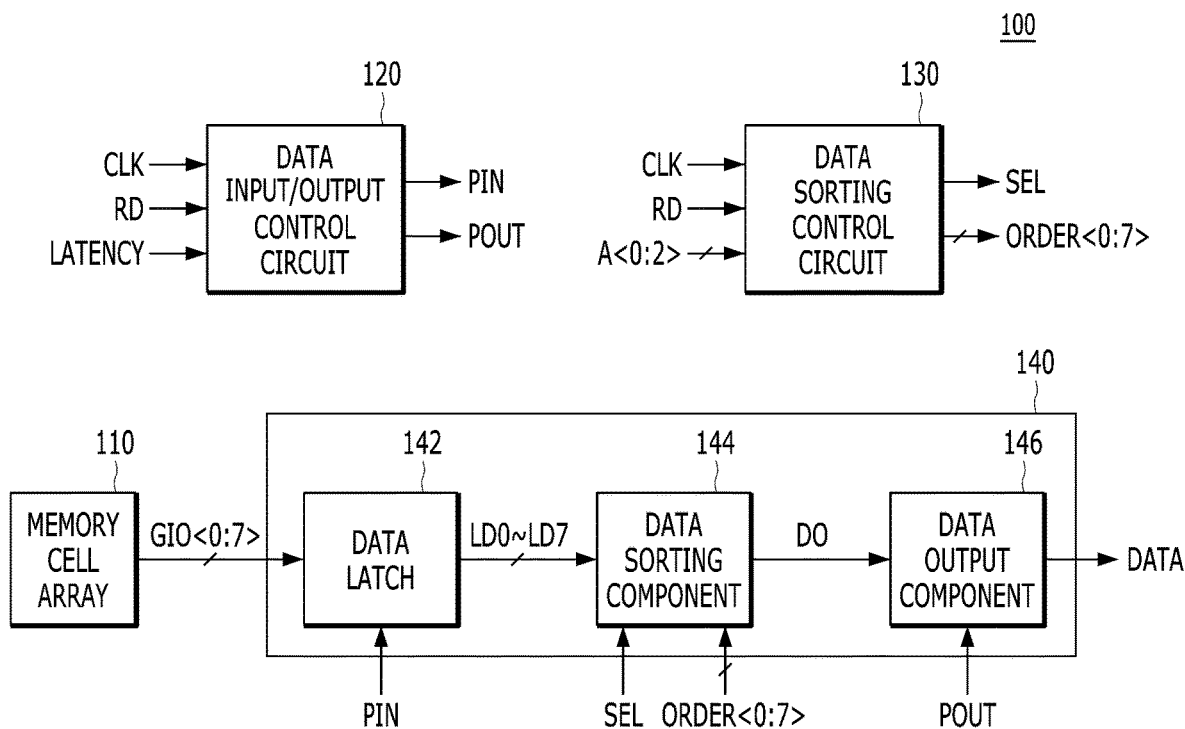
FIG. 1 is a block diagram illustrating a memory device according to an embodiment of the disclosure.

FIG. 1 is a block diagram illustrating a memory device 100 according to an embodiment of the disclosure. By way of example, FIG. 1 illustrates a configuration for sorting read data in the memory device 100. The memory device 100 may include a memory cell array 110, a data input and output (input/output) control circuit 120, a data sorting control circuit 130, and a data sorting circuit 140.

The memory cell array 110 may include a plurality of memory cells. During a read operation, data may be read, in parallel, from the plurality of memory cells of the memory cell array 110. The read data may be transmitted to the data sorting circuit 140 via a global input/output line. By way of example, first data to eighth data (GIO<0:7>) may be transmitted to the data sorting circuit 140 at each operation cycle. The number of data items transmitted is not limited to eight. Any suitable number of data items may be transmitted.

The data input/output control circuit 120 may generate input/output control signals PIN and POUT based on a clock signal CLK, a read command RD, and a read latency LATENCY. When the read command RD is input to the memory device 100, output enable signals may be generated to control the circuits on the data path according to the read operation. The signal corresponding to the read command RD may be delayed as long as the read latency LATENCY, and the delayed signal may be shifted, so that a plurality of output enable signals corresponding to several timings may be generated.

The data input/output control circuit 120 may generate an input control signal PIN and an output control signal POUT corresponding to any one of the plurality of output enable signals based on the read command RD and the read latency LATENCY. The input control signal PIN and the output control signal POUT each may be generated in synchronization with the clock signal CLK and be used to control the input and output of a pipe latch included in the data sorting circuit 140.

The data sorting control circuit 130 may determine a data order based on the clock signal CLK, read command RD, and a seed address (A<0:2>). Further, the data sorting control circuit 130 may generate a selection control signal SEL and first to eighth sorting control signals (ORDER<0:7>) according to the determined order. In other words, the data sorting control circuit 130 may determine a burst order of the first to eighth data (GIO<0:7>) read from the memory cell array 110 according to the seed address (A<0:2>). The seed address (A<0:2>) corresponds to the column address applied to the memory device 100, along with the read command RD, during a read operation. The seed address (A<0:2>) is described below in greater detail with reference to Table 1.

The data sorting circuit 140 may include a data latch 142, a data sorting component 144, and a data output component 146. The data sorting circuit 140 may sort the first to eighth data (GIO<0:7>) in response to the control signals (PIN, POUT, SEL, and ORDER<0:7>) and output the final data DATA.

The data latch 142 may store the first to eighth data (GIO<0:7>) in response to the input control signal PIN. The data latch 142 may latch the first to eighth data (GIO<0:7>) and output the latched data as first latch data LD0 to eighth latch data LD7.

The data sorting component 144 may sort the first to eighth data LD0 to LD7 in response to the selection control signal SEL and the first to eighth sorting control signals (ORDER<0:7>) and output the sorted data as serial data DO. The data sorting component 144 may select the first to eighth latch data LD0 to LD7 in response to the selection control signal SEL, sort the selected data according to the data order determined by the data sorting control circuit 130, i.e., the first to eighth sorting control signals (ORDER<0:7>) and output the serial data DO. The data sorting component 144 is described below in greater detail.

The data output component 146 may synchronize the serial data DO with the output control signal POUT and output the final data DATA. When the read command RD is input to the memory device 100, the data output component 146 may output the read latency-applied final data DATA to the outside of the memory device 100.

The seed address (A<0:2>) may include the three least significant bits among multiple bits of the column address applied to the memory device 100, together with the read command RD during a read operation. The memory device 100 may output the data in the burst order determined according to the seed address (A<0:2>). Referring to Table 1, the burst order of the data output from the memory device 100 may be identified according to the seed address (A<0:2>).

TABLE 1

| Seed address | | | Burst order | | | | | | | |
|---|---|---|---|---|---|---|---|---|---|---|
| A2 | A1 | A0 | | | | | | | | |
| 0 | 0 | 0 | BL<0> | BL<1> | BL<2> | BL<3> | BL<4> | BL<5> | BL<6> | BL<7> |
| 0 | 0 | 1 | BL<1> | BL<2> | BL<3> | BL<0> | BL<5> | BL<6> | BL<7> | BL<4> |
| 0 | 1 | 0 | BL<2> | BL<3> | BL<0> | BL<1> | BL<6> | BL<7> | BL<4> | BL<5> |
| 0 | 1 | 1 | BL<3> | BL<0> | BL<1> | BL<2> | BL<7> | BL<4> | BL<5> | BL<6> |
| 1 | 0 | 0 | BL<4> | BL<5> | BL<6> | BL<7> | BL<0> | BL<1> | BL<2> | BL<3> |
| 1 | 0 | 1 | BL<5> | BL<6> | BL<7> | BL<4> | BL<1> | BL<2> | BL<3> | BL<0> |
| 1 | 1 | 0 | BL<6> | BL<7> | BL<4> | BL<5> | BL<2> | BL<3> | BL<0> | BL<1> |
| 1 | 1 | 1 | BL<7> | BL<4> | BL<5> | BL<6> | BL<3> | BL<0> | BL<1> | BL<2> |

In this case, the data (GIO<0:7>) read via the global input/output line from the memory cell array 110 may individually correspond to the data (BL<0:7>) according to the burst order. In other words, when the seed address (A<0:2>) is (0,0,0), the data (GIO<0:7>) read from the memory cell array 110 via the global input/output line may be sequentially output from the memory device 100, e.g., to another device. Whenever the seed address (A<0:2>) is varied, the read data (GIO<0:7>) may be output from the memory device 100 in a different order based on the seed address. The conditions of Table 1 may be previously determined based on the specification of the memory device 100.

As the operation speed increases, the memory device 100 may output data based on the multi-phase clock signals which are generated by dividing the system clock signal. For example, the memory device 100 may use 4-phase clock signals, of which adjacent clock signals have a 90-degree phase difference. In this case, when the read command RD is input, the order of sorting the read data (GIO<0:7>) by the clock signals may be varied according to the phase of the clock signals. Thus, if the memory device 100 minimizes the changes in the burst order of the read data (GIO<0:7>) according to the phase of the clock signals and the seed address (A<0:2>), it may be possible to reduce current consumption and increase the timing gain in the read operation of the memory device 100.

Figure 2:
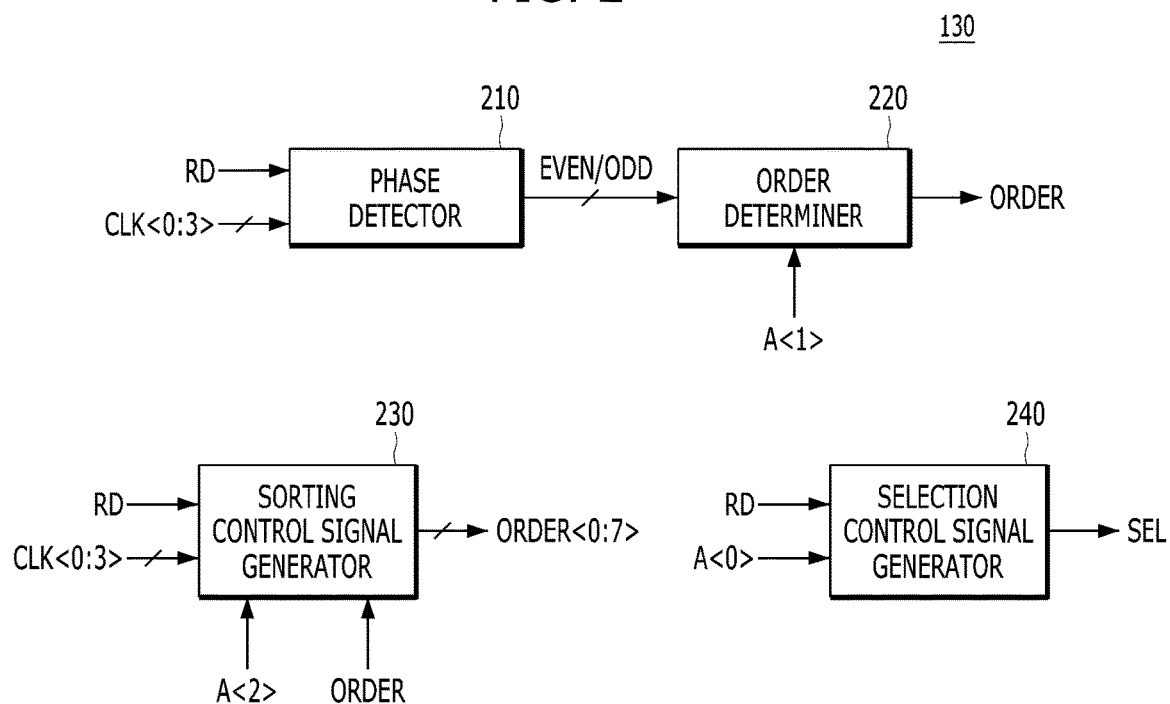
FIG. 2 is a block diagram illustrating a data sorting control circuit, such as that shown in FIG. 1.

FIG. 2 is a block diagram illustrating a data sorting control circuit 130 as shown in FIG. 1. The data sorting control circuit 130 may include a phase detector 210, an order determiner 220, a sorting control signal generator 230, and a selection control signal generator 240.

According to an embodiment, a first clock signal to a fourth clock signal (CLK<0:3>) may be used as the clock signal CLK of FIG. 1. The first to fourth clock signals (CLK<0:3>) may include divided signals, of which adjacent signals have a 90-degree phase difference, which are obtained by dividing a system clock signal input to the memory device 100.

The phase detector 210 may detect the phases of the first to fourth clock signals (CLK<0:3>) in response to a read command RD. The phase detector 210 may detect the phases of, among others, the first and third clock signals (CLK<0> and CLK<2>) at the time of input of the read command RD and may thereby generate even and odd signals EVEN and ODD.

The phase detector 210 may detect a forward phase or a reverse phase of a clock signal based on the read command RD. When the read command RD is input in synchronization with the first clock signal CLK<0> (i.e., a rising edge of CLK<0>, the phase detector 210 may detect it as having a forward phase and activate the even signal EVEN. In contrast, when the read command RD is input in synchronization with the third clock signal CLK<2> (i.e., a rising edge of CLK<2> or a falling edge of CLK<0>), the phase detector 210 may detect it as having a reverse phase and activate the odd signal ODD. The conditions for activating the even signal EVEN and the odd signal ODD may be reversed or varied according to an embodiment of the disclosure.

The order determiner 220 may determine the data order based on the second address (A<1>) of the seed address (A<0:2>) and the phase detected by the phase detector 210. The order determiner 220 may determine that the data is to be sorted in a first order or a second order and may accordingly activate or deactivate an order control signal ORDER. The configuration and operation of the order determiner 220 are described below in greater detail with reference to FIG. 3.

The sorting control signal generator 230 may generate the first to eighth sorting control signals (ORDER<0:7>) by shifting the read command RD based on the first to fourth clock signals (CLK<0:3>). The sorting control signal generator 230 may output the first to eighth sorting control signals (ORDER<0:7>) in the order according to the third address (A<2>) of the seed address (A<0:2>) and the order control signal ORDER. The sorting control signal generator 230 may include a plurality of shifters (not shown).

The sorting control signal generator 230 may generate the first to fourth sorting control signals (ORDER<0:3>) by shifting the output enable signal generated from the read command RD as much as the phase difference of adjacent clock signals among the first to fourth clock signals (CLK<0:3>). Likewise, the sorting control signal generator 230 may generate the fifth to eighth sorting control signals (ORDER<4:7>) by shifting the output enable signal as much as the phase difference of adjacent clock signals among the first to fourth clock signals (CLK<0:3>). The first to fourth sorting control signals (ORDER<0:3>) and the fifth to eighth sorting control signals (ORDER<4:7>) may correspond to the first to fourth data (GIO<0:3>) and the fifth to eighth data (GIO<4:7>), respectively.

In this case, the sorting control signal generator 230 may output the first to fourth sorting control signals (ORDER<0:3>) and the fifth to eighth sorting control signals (ORDER<4:7>) according to a first or second order determined by the order determiner 220. For example, when the order determiner 220 determines that the data order is the first order and activates the order control signal ORDER, the sorting control signal generator 230 may output the first to fourth sorting control signals (ORDER<0:3>) in ascending order, that is, in the order of the first sorting control signal (ORDER<0>), the second sorting control signal (ORDER<1>), the third sorting control signal (ORDER<2>), and the fourth sorting control signal (ORDER<3>). Likewise, the sorting control signal generator 230 may output the fifth to eighth sorting control signals (ORDER<4:7>) in ascending order, that is, in the order of the fifth sorting control signal (ORDER<4>), the sixth sorting control signal (ORDER<5>), the seventh sorting control signal (ORDER<6>), and the eighth sorting control signal (ORDER<7>).

When the order determiner 220 determines that the data order is the second order and deactivates the order control signal ORDER, the sorting control signal generator 230 may output the first to fourth sorting control signals (ORDER<0:3>) in the order of the third sorting control signal (ORDER<2>), the fourth sorting control signal (ORDER<3>), the first sorting control signal (ORDER<0>), and the second sorting control signal (ORDER<1>). Likewise, the sorting control signal generator 230 may output the fifth to eighth sorting control signals (ORDER<4:7>) in the order of the seventh sorting control signal (ORDER<6>), the eighth sorting control signal (ORDER<7>), the fifth sorting control signal (ORDER<4>), and the sixth sorting control signal (ORDER<5>).

Further, the sorting control signal generator 230 may determine the order of the first to fourth sorting control signals (ORDER<0:3>) and the fourth to eighth sorting control signals (ORDER<4:7>) which are first output, according to the third address (A<2>) of the seed address (A<0:2>). When the third address (A<2>) of the seed address (A<0:2>) is at a logic low level ('0'), the sorting control signal generator 230 may output the first to fourth sorting control signals (ORDER<0:3>) and then the fourth to eighth sorting control signals (ORDER<4:7>). When the third address (A<2>) of the seed address (A<0:2>) is at a logic high level ('1'), the sorting control signal generator 230 may output the fifth to eighth sorting control signals (ORDER<4:7>) and then the first to fourth sorting control signals (ORDER<0:3>).

The selection control signal generator 240 may generate a selection control signal SEL based on the first address (A<0>) of the seed address (A<0:2>). When the read command RD is input, the selection control signal generator 240 may latch the first address (A<0>) of the seed address (A<0:2>) and activate, or deactivate, the selection control signal SEL.

Figure 3:
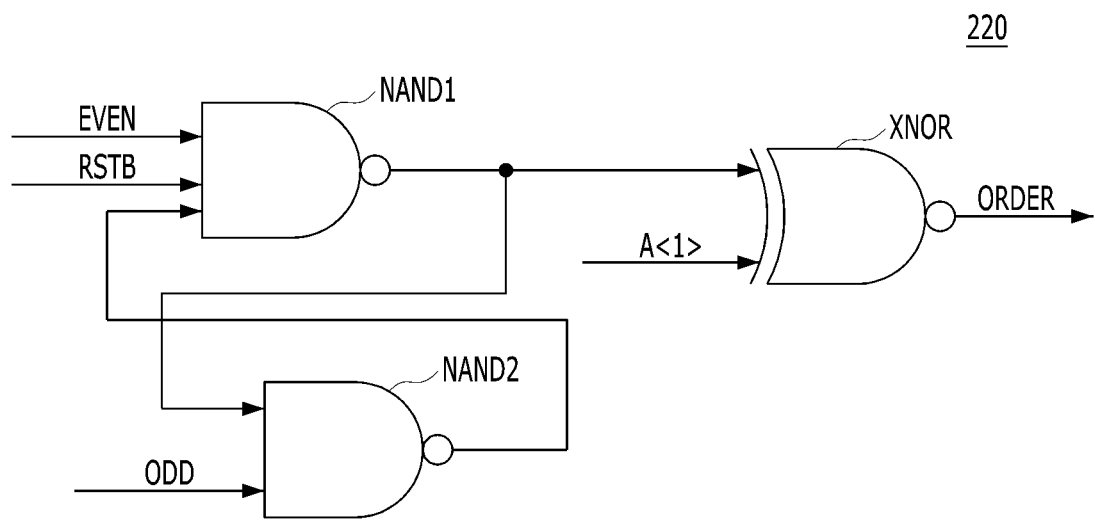
FIG. 3 is a circuit diagram illustrating an order determining component, such as that shown in FIG. 2.

FIG. 3 is a circuit diagram illustrating an order determiner 220 as shown in FIG. 2. The order determiner 220 may include a first NAND gate NAND1, a second NAND gate NAND2 and an exclusive NOR (XNOR) gate XNOR.

The first NAND gate NAND1 may receive an even signal EVEN, a reset signal RSTB, and the output signal of the second NAND gate NAND2 and perform a NAND operation on the received signals. In this case, the reset signal RSTB may include a signal which is activated at the logic low level ('0') during a reset operation by the order determiner 220.

The second NAND gate NAND2 may receive the output signal of the first NAND gate NAND1 and an odd signal ODD and perform a NAND operation on the received signals. The XNOR gate XNOR may receive the output signal of the first NAND gate NAND1 and the second address (A<1>) of the seed address (A<0:2>), perform an XNOR operation on the received signals, and output an order control signal ORDER.

When it is detected that the read command RD is input in a forward phase with respect to a clock signal, e.g., when the read command RD is input in synchronization with a rising edge of CLK<0>, the phase detector 210 may activate the even signal EVEN and deactivate the odd signal ODD. Thus, the second NAND gate NAND2 may output the output signal at the logic high level ('1'), and the first NAND gate NAND1 may output the output signal at the logic low level ('0').

When the second address (A<1>) of the seed address (A<0:2>) is at the logic low level ('0'), the XNOR gate XNOR may activate the order control signal ORDER, and the order determiner 220 may determine that the data order is the first order. When the second address (A<1>) of the seed address (A<1:2>) is at the logic high level ('1'), the XNOR gate XNOR may deactivate the order control signal ORDER, and the order determiner 220 may determine that the data order is the second order.

In contrast, when it is detected that the read command RD is input in a reverse phase of the clock signal, e.g., when the read command RD is input in a falling edge of CLK<0> or a rising edge of CLK<2>, the phase detector 210 may deactivate the even signal EVEN and activate the odd signal ODD. Thus, the first NAND gate NAND1 may output the output signal at the logic high level ('1'), and the second NAND gate NAND2 may output the output signal at the logic low level ('0').

When the second address (A<1>) of the seed address (A<0:2>) is at the logic low level ('0'), the XNOR gate XNOR may deactivate the order control signal ORDER, and the order determiner 220 may determine that the data order is the second order. When the second address (A<1>) of the seed address (A<1:2>) is at the logic high level ('1'), the XNOR gate XNOR may activate the order control signal ORDER, and the order determiner 220 may determine that the data order is the first order.

Figure 4:
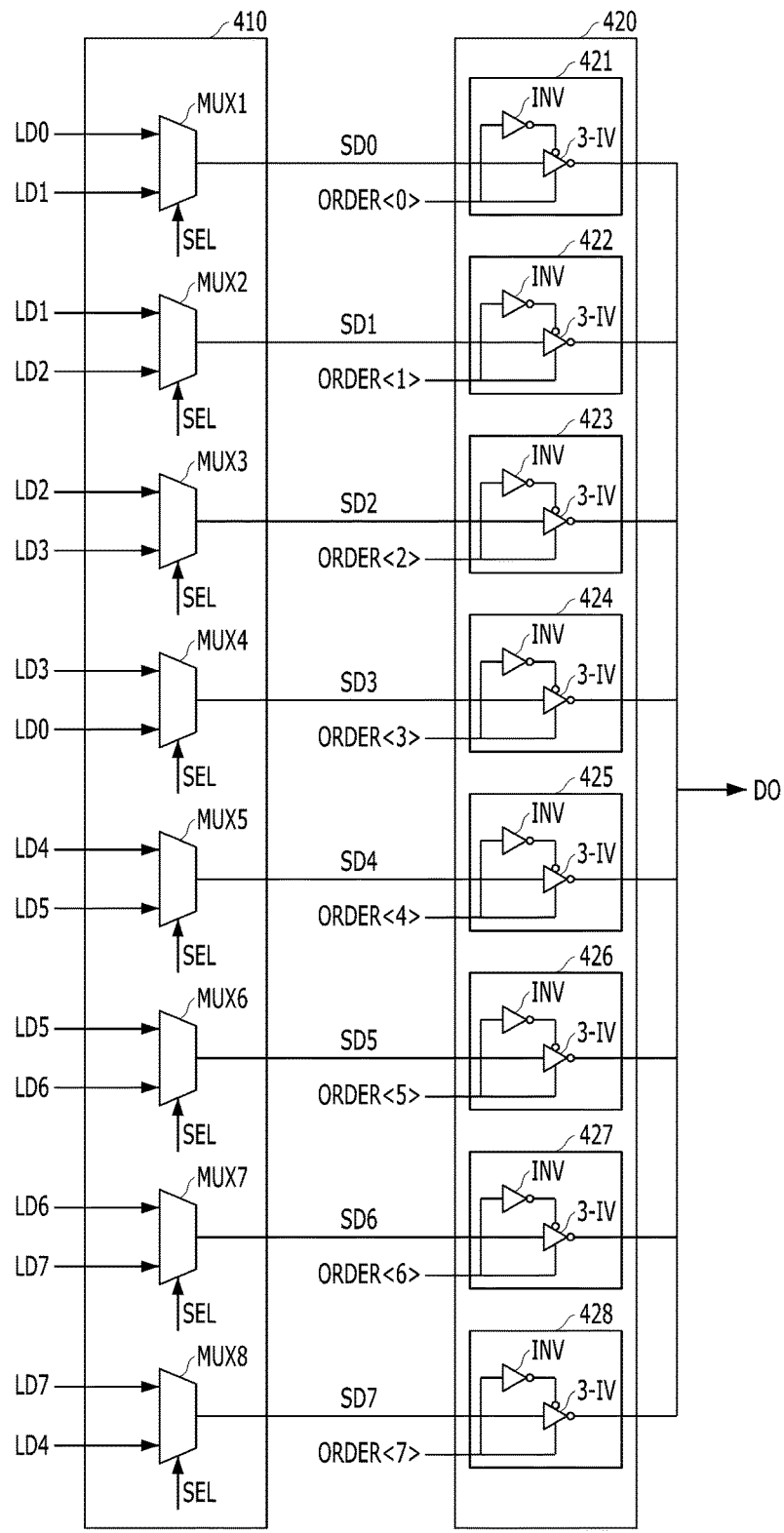
FIG. 4 is a circuit diagram illustrating a data sorting component, such as that shown in FIG. 1.

FIG. 4 is a circuit diagram illustrating a data sorting component 144 as shown in FIG. 1. The data sorting component 144 may include a data selector 410 and a data transmitter 420.

The data selector 410 may select first to eighth latch data LD0 to LD7 in response to a selection control signal SEL and output the selected latch data as first to eighth selection data SD0 to SD7. The data selector 410 may include a first selection component MUX1 to an eighth selection component MUX8.

Each of the first to fourth selection components MUX1 to MUX4 may receive two data items among the first to fourth latch data LD0 to LD3. Each of the first to fourth selection components MUX1 to MUX4 may select one of the two data items input in response to the selection control signal SEL and output the selected data item as selection data, i.e., SD0 to SD3 for MUX1 to MUX4, respectively.

Likewise, each of the fifth to eighth selection components MUX5 to MUX8 may receive two data items among the fifth to eighth latch data LD4 to LD7. Each of the fifth to eighth selection components MUX5 to MUX8 may select one of the two data items input in response to the selection control signal SEL and output the selected data item as selection data, i.e., SD4 to SD7 for MUX5 to MUX8, respectively.

Referring to Table 1, it may be identified that as the first address (A<0>) of the seed address (A<0:2>) switches from the logic low level ('0') to the logic high level ('1'), a change is made to the order of the first to fourth data (BL<0:3>) and the fifth to eighth data (BL<4:7>). The first to eighth data (BL<0:7>) may correspond to the first to eighth latch data LD0 to LD7, respectively.

In other words, when the first address (A<0>) of the seed address (A<0:2>) is at the logic low level ('0'), the selection control signal SEL may be deactivated. The first to eighth selection components MUX1 to MUX8 may select the first to eighth latch data LD0 to LD7, respectively, and output the selected data as first to eighth selection data SD0 to SD7. In contrast, as the first address (A<0>) of the seed address (A<0:2>) switches from the logic low level ('0') to the logic high level ('1'), the selection control signal SEL may be activated. When the selection control signal SEL is activated, the first to fourth selection components MUX1 to MUX4 may output the second latch data LD1, the third latch data LD2, the fourth latch data LD3, and the first latch data LD0 as the first to fourth selection data SD0 to SD4, respectively. The fifth to eighth selection components MUX5 to MUX8 may output the sixth latch data LD5, the seventh latch data LD6, the eighth latch data LD7, and the fifth latch data LD4 as the fifth to eighth selection data SD4 to SD7, respectively.

The data transmitter 420 may sort the first to eighth selection data SD0 to SD7 in response to the first to eighth sorting control signals (ORDER<0:7>) and output them as serial data DO. The data transmitter 420 may include a first transmission component 421 to an eighth transmission component 428.

Each of the first to eighth transmission components 421 to 428 each may include an inverter INV and a three-phase inverter 3-IV. When, among the first to eighth sorting control signals (ORDER<0:7>), corresponding sorting control signals are activated, the first to eighth transmission components 421 to 428 may output their corresponding data, among the first to eighth selection data SD0 to SD7, as serial data DO.

In other words, the first to eighth sorting control signals (ORDER<0:7>) may correspond to the first to eighth selection data SD0 to SD7, respectively. The data transmitter 420 may output the first to eighth selection data SD0 to SD7 as serial data DO, corresponding to the order in which the first to eighth sorting control signals (ORDER<0:7>) are input.

Figure 5:
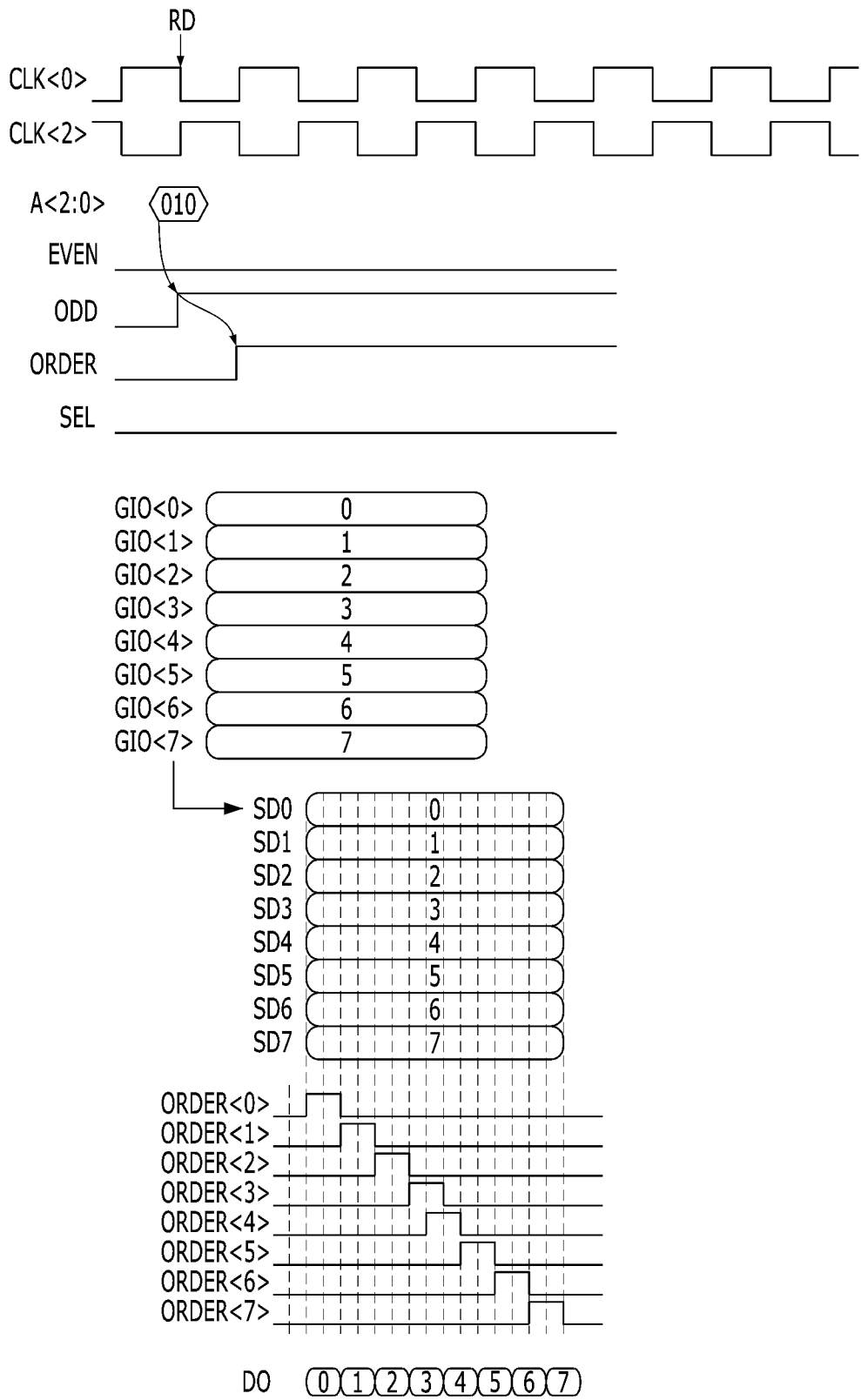
FIG. 5 is a signal waveform view illustrating operations of a memory device according to an embodiment of the disclosure.

FIG. 5 is a signal waveform view illustrating operations of a memory device 100 according to an embodiment of the disclosure.

By way of example, FIG. 5 illustrates that a read command RD is input in reverse phase, and the second address (A<1>) of the seed address (A<0:2>) is at the logic high level. Referring to FIG. 5, since the other addresses (A<0> and A<2>) have the logic low level, variations in burst order resultant therefrom may not be taken into consideration.

As the read command RD is input in synchronization with the third clock signal (CLK<2>), the phase detector 210 may detect the reverse phase and activate the odd signal ODD while deactivating the even signal EVEN. At this time, since the second address (A<1>) of the seed address (A<0:2>) is at the logic high level, the order determiner 220 may activate the order control signal ORDER.

As described above, since the first address (A<0>) of the seed address (A<0:2>) has the logic low level, the selection control signal generator 240 may deactivate the selection control signal SEL. The data selector 410 may output the first to eighth latch data LD0 to LD7, i.e., the first to eighth data (GIO<0:7>), as the first to eighth selection data SD0 to SD7, respectively.

Since the third address (A<2>) of the seed address (A<0:2>) has the logic low level, the sorting control signal generator 230 may output the first to fourth sorting control signals (ORDER<0:3>) and then the fourth to eighth sorting control signals (ORDER<4:7>). Since the order control signal ORDER has been activated, the sorting control signal generator 230 may sequentially generate the first to eighth sorting control signals (ORDER<0:7>) as shown in FIG. 5. The data transmitter 420 may sequentially sort the first to eighth selection data SD0 to SD7 in response to the first to eighth sorting control signals (ORDER<0:7>) sequentially input, and the data transmitter 420 may output them as serial data DO.

As a result, when data is sorted based on multi-phase clock signals, the scheme of changing the data order according to the detected phase is identical to the scheme of determining the burst order of data according to the second address (A<1>) of the seed address (A<0:2>). Thus, it may take long and cause unnecessary duplicate operations to determine the burst order by reflecting the order of the seed address (A<0:2>) and sort data according to the detected phase.

According to an embodiment of the disclosure, signals for sorting data may simultaneously be generated based on the combination of the logic level of the second address (A<1>) and the detected phase of multi-phase clock signal. In the illustrated example of FIG. 5, although the reverse phase has been detected, the read data (GIO<0:7>) may be output in order because the second address (A<1>) has the logic high level. In this case, the first to eighth sorting control signals (ORDER<0:7>) may be simultaneously generated by omitting the duplicate steps corresponding to the conditions and combining the conditions.

A memory device may minimize changes in the burst order of data according to the seed address in reading and sorting data based on multi-phase clock signals. By combining several conditions according to the phase of the multi-phase clock signals and the seed address, sorting control signals for sorting data may be generated at once. This allows duplicate steps corresponding to the conditions to be skipped, increasing the timing gain and reducing the current consumption in the read operation of the memory device.

While the present invention has been described with respect to specific embodiments, this is merely for description purposes and is not intended to limit the invention. It will be apparent to those skilled in the art that various changes and modifications may be made without departing from the spirit and scope of the invention. Thus, the invention encompasses all variations that fall within the claims and equivalents thereof.

What is claimed is:

1. A memory device, comprising:
   a memory cell array including a plurality of memory cells;
   a data sorting control circuit suitable for determining a data order based on a read command, a clock signal, and a seed address and generating a selection control signal and a plurality of sorting control signals according to the determined data order; and
   a data sorting circuit suitable for sorting a plurality of data read from the memory cell array to output serial data in response to the selection control signal and the plurality of sorting control signals,
   wherein the selection control signal is generated based on a first address of the seed address, and the plurality of sorting control signals are generated by shifting the read command based on the clock signals.

2. The memory device of claim 1, wherein the seed address includes first to third addresses.

3. The memory device of claim 2, wherein the data sorting control circuit includes:
   a phase detector suitable for detecting a phase of the clock signal in response to the read command;
   an order determiner suitable for determining the data order based on the detected phase and the second address of the seed address and activating an order control signal according to the determined data order; and
   a sorting control signal generator suitable for shifting the read command based on the clock signal to generate a first sorting control signal to an eighth sorting control signal, and outputting the first sorting control signal to the eighth sorting control signal in the order according to the order control signal and the third address of the seed address.

4. The memory device of claim 3,
   wherein, when the detected phase is a forward phase, the order determiner activates the order control signal in response to the second address at a logic low level and deactivates the order control signal in response to the second address at a logic high level, and
   wherein, when the detected phase is a reverse phase, the order determiner activates the order control signal in response to the second address at a logic high level and deactivates the order control signal in response to the second address at a logic low level.

5. The memory device of claim 3, wherein the data sorting control circuit further includes a selection control signal generator suitable for generating the selection control signal based on the first address of the seed address.

6. The memory device of claim 5, wherein the data sorting circuit includes:
   a data selector suitable for selecting and outputting first data to eighth data among the plurality of data in response to the selection control signal; and
   a data transmitter suitable for sorting the data selected by the data selector to output the serial data in response to the first sorting control signal to the eighth sorting control signal.

7. The memory device of claim 6, further comprising a data input/output control circuit suitable for generating an input control signal and an output control signal based on the read command, the clock signal, and read latency.

8. The memory device of claim 7, wherein the data sorting circuit further includes:
   a data latch suitable for latching the plurality of data to output first latch data to eighth latch data to the data selector in response to the input control signal; and
   a data output component suitable for outputting the serial data in synchronization with the output control signal.

9. A memory device comprising:
   a memory cell array;
   a data sorting control circuit suitable for detecting at which edge of a clock signal a read command is input, determining a data order based on a combination of a seed address and the detected edge, and generating a sorting control signal and a selection control signal, based on the data order; and a data sorting circuit suitable for receiving a plurality of data items in parallel from the memory cell array, sorting the plurality of data items based on the sorting control signal and the selection control signal and serially outputting the sorted data items, wherein the selection control signal is generated based on a first address of the seed address, and the sorting control signal is generated by shifting the read command based on the clock signal.

* * * * *